US009548208B2

(12) United States Patent
Chan et al.

(10) Patent No.: US 9,548,208 B2
(45) Date of Patent: Jan. 17, 2017

(54) METHOD FOR PATTERNING AN UNDERLYING LAYER

(71) Applicant: IMEC VZW, Leuven (BE)

(72) Inventors: Boon Teik Chan, Leuven (BE); Zheng Tao, Leuven (BE); Nadia Vandenbroeck, Geetbets (BE); Safak Sayan, Tervuren (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/045,923

(22) Filed: Feb. 17, 2016

(65) Prior Publication Data

US 2016/0254161 A1    Sep. 1, 2016

(30) Foreign Application Priority Data

Feb. 27, 2015   (EP) .................................... 15157046

(51) Int. Cl.
*H01L 21/311*       (2006.01)
*H01L 21/308*       (2006.01)
(Continued)

(52) U.S. Cl.
CPC ....... *H01L 21/3081* (2013.01); *H01L 21/0337* (2013.01); *H01L 21/0338* (2013.01); *H01L 21/3086* (2013.01); *H01L 29/66795* (2013.01)

(58) Field of Classification Search
CPC ............ H01L 21/3081; H01L 21/0337; H01L 21/0338; H01L 21/3086
See application file for complete search history.

(56) References Cited

U.S. PATENT DOCUMENTS 8,470,711 B2   6/2013   Arnold et al.
8,828,253 B2   9/2014   Koole et al.
(Continued)

FOREIGN PATENT DOCUMENTS

EP   2 717 296 A1   4/2014

OTHER PUBLICATIONS

European Search Report, European Patent Application No. 15157046.2, dated Aug. 17, 2015.
(Continued)

*Primary Examiner* — Bradley K Smith
(74) *Attorney, Agent, or Firm* — McDonnell Boehnen Hulbert & Berghoff LLP

(57) ABSTRACT

A method for patterning an underlying layer is described, the method comprising providing a guiding layer on the underlying layer, the guiding layer comprising guiding structures and being substantially planar; providing a block-copolymer layer on the guiding layer; inducing phase separation of the block-copolymer layer in a regular pattern of structures of a first and a second polymer component, whereby one of the components aligns to the guiding structures, by chemoepitaxy; thereafter, removing a first of the components of the block-copolymer layers completely, leaving a regular pattern of structures of the second component; providing a planarizing layer over the regular pattern of structures of the second component and the guiding layer; removing a portion of the planarizing layer, thereby leaving a regular pattern of structures of the planarizing layer at positions in between the structures of the second component, and exposing the structures of the second component; removing the structures of the second component, selectively with respect to the structures of the planarizing layer; and patterning the underlying layer, thereby using the structures of the planarizing layer as a mask.

12 Claims, 20 Drawing Sheets

(51) Int. Cl.
*H01L 21/033* (2006.01)
*H01L 29/66* (2006.01)

(56) References Cited

U.S. PATENT DOCUMENTS

| | | | |
|---|---|---|---|
| 9,371,427 B2* | 6/2016 | Kobayashi | C23F 1/00 |
| 2011/0008956 A1 | 1/2011 | Lee et al. | |
| 2013/0140272 A1 | 6/2013 | Koole et al. | |
| 2014/0273469 A1 | 9/2014 | Wahl et al. | |
| 2014/0335324 A1* | 11/2014 | Kim | B44C 1/227 |
| | | | 428/195.1 |
| 2015/0243514 A1* | 8/2015 | Ruiz | H01L 21/3086 |
| | | | 438/702 |
| 2016/0204002 A1* | 7/2016 | Wallace | H01L 21/76897 |
| | | | 257/773 |

OTHER PUBLICATIONS

Delgadillo, Paulina Rincon et al., "Defect Source Analysis of Directed Self-Assembly Process (DSA of DSA)", Proc. of SPIE vol. 8680, 2013, pp. 86800L-1-86800L-9.

* cited by examiner

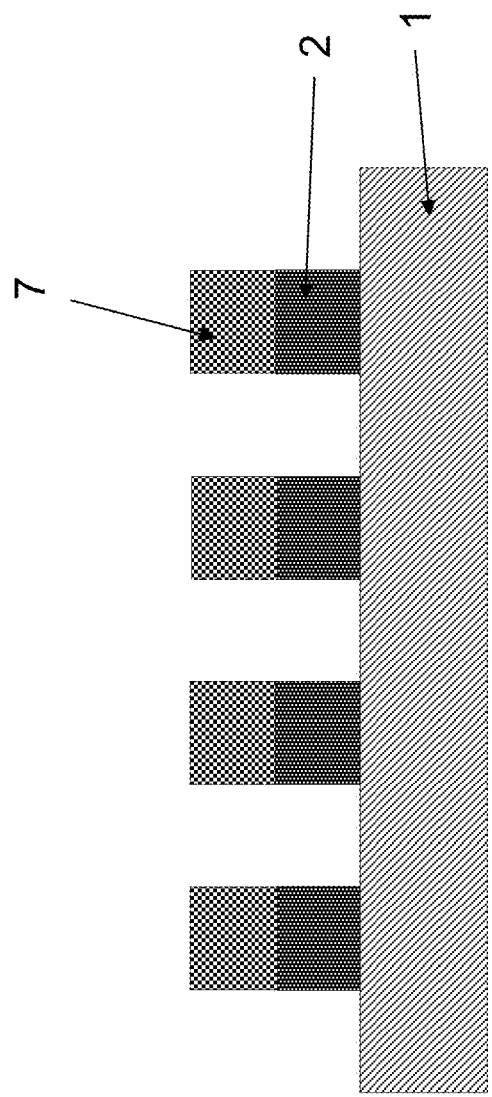

METHOD FOR PATTERNING AN UNDERLYING LAYER

CROSS-REFERENCE TO RELATED APPLICATIONS

The present application is a non-provisional patent application claiming priority to European Patent Application No. 15157046.2 filed Feb. 27, 2015, the contents of which are hereby incorporated by reference.

FIELD OF THE DISCLOSURE

The present disclosure relates to the field of semiconductor processing, more specifically to methods for patterning a layer making use of a directed self assembly (DSA) process of a block copolymer layer. In example embodiments, the method may be used to define fin structures of transistor devices of the FINFET type.

BACKGROUND

Photolithographic image formation in a photosensitive polymer layer followed by plasma-based transfer of the defined photoresist patterns into other materials has been remarkably successful in enabling the production of micro- and nanometer-scale electronic features. This has required a continuous evolution of materials and patterning techniques such as new photolithography systems, appropriate photopolymer resists, and innovative etching equipment and processes.

For patterned structures, the critical dimension (CD) relates to the width of the patterned structures, e.g. patterned lines. The variation of the line width is expressed by the Line Width Roughness (LWR) value. The variation of the edges of the line with respect to an ideal case is expressed as Line Edge Roughness (LER).

The manufacturing of sub-20 nm technologies has triggered a radical change in photoresist-materials; consequently, this technology has to face many new challenges such as controlling line width and line edge roughness (LWR and LER). Effects of line width roughness and line edge roughness become more important as feature dimensions become smaller, which makes the control of LWR and LER a major scaling concern. This line width roughness, defined as the 3σ critical dimension (CD) variation along a segment of a line, is having a big impact on the transistor performance. In addition, increased LWR also induces higher variance in device performance which can affect circuit stability. Devices fabricated with the 20 nm node technology are for instance required to have a maximum allowable LWR which is smaller than or equal to 2 nm. The current best LWR that can be achieved in photoresist using EUV lithography is about 3 to 4 nm. A substantial improvement in LWR of the patterned structures is required to minimize the impact on device performance.

Directed self-assembly (DSA) of block-copolymers is an emergent alternative approach to nanolithography. Block-copolymers consist of chemically different polymer blocks interconnected by covalent bonds. The chemically different polymer blocks undergo a microphase separation, which is driven by repulsion between the dissimilar polymer chains, such that homogenous domains in a periodic nanostructure are formed after annealing. The type of structure which is formed is for instance controllable by tuning the ratios of the different polymer block lengths. However, the block-copolymer material may feature random orientation and a poor long-range order when not constrained by orientation control techniques. Such techniques, for example grapho-epitaxy or chemical epitaxy, selectively direct the formation of domains in the block-copolymer material. Through subsequent selective removal of one polymer type, a patterned structure of gaps is formed which can be used as a resist layer on the underlying substrate.

In "Defect source analysis of directed self-assembly process (DSA of DSA)", Paulina Rincon Delgadillo et al., Proc. of SPIE Vol. 8680, 86800L, 2013, the use of a DSA technique for patterning is described, known as the Liu-Nealey flow or "LiNe flow". The Liu-Nealey flow process combines standard lithography to direct the self assembly of lamellar block-copolymers to fabricate features at a finer pitch than can be achieved with lithography alone.

European Patent Application No. 2717296 and U.S. Pat. No. 8,828,253 relate to methods that provide high selectivity in the removal of a first component of a phase separated DSA layer with respect to a second component, the latter being then used to pattern an underlying layer. Such a highly selective material removal may increase the overall performance of the process with respect to LWR and/or LER of the patterned underlying layer.

Although relatively good performance with respect to LER and LWR can be achieved with DSA, there still exists a need to further reduce LWR and LER, for instance for sub-20 nm technologies.

SUMMARY

It is an aim of the present disclosure to provide a method for pattern formation (such as a parallel line-space periodic pattern) on a substrate by making use of DSA of a block copolymer layer, based on chemo-epitaxy, which allows reducing LWR and LER of finally patterned structures and provides an improved process control.

This aim is achieved according to the disclosure with the method showing the technical characteristics of the first independent claim.

The present disclosure provides a method for patterning an underlying layer, the method comprising:
  providing a guiding layer on the underlying layer, the guiding layer comprising guiding structures and being substantially planar;
  providing a block-copolymer layer on the guiding layer;
  inducing phase separation of the block-copolymer layer in a regular pattern of structures of a first and a second polymer component, whereby one of the components aligns to the guiding structures, by chemo-epitaxy;
  thereafter, removing a first of the components of the block-copolymer layer completely, leaving a regular pattern of structures of the second component;
  providing a planarizing layer over the regular pattern of structures of the second component and the guiding layer;
  removing a portion of the planarizing layer, thereby leaving a regular pattern of structures of the planarizing layer (only) at positions in between the structures of the second component, and exposing the structures of the second component;
  removing the structures of the second component, selectively with respect to the structures of the planarizing layer; and
  patterning the underlying layer, thereby using the structures of the planarizing layer as a mask.

According to example embodiments, removing the first component of the block-copolymer layers completely, whereby the guiding layer becomes exposed where (or on which) the first component was present before, is performed by means of a single etching step.

A block co-polymer (BCP) refers to a polymer comprising two or more chemically different polymer blocks (which may be named as respective "components") covalently bonded to each other. A block co-polymer with two different polymer blocks is called a "di-block co-polymer". A block co-polymer with three different polymer blocks is called a "tri block co-polymer".

The regular patterns formed by DSA of BCP are known to the skilled person. A regular pattern can for instance comprise regularly spaced, e.g. parallel, lines, which can be separated by spaces. The two components of the BCP may form a layer of alternating lines of the first component and the second component. These lines can for instance be parallel. The skilled person will recognize that, other, for instance random and/or aperiodic patterns, may also be generated using carefully defined guiding patterns.

Providing a guiding layer can comprise providing a guiding structures, and laterally embedding the guiding structures with a neutral layer. For instance, a brush layer can be applied, embedding the guiding structures. The lower portion of the brush layer is grafted and the non-grafted portion, which is in excess, is removed, for instance by rising. The NUL layer and grafting process may be predetermined such that the height of the grafted portion is substantially equal to the height of the guiding structures.

According to example embodiments, the following processes may be performed in accordance with a LiNe flow:
  providing a guiding layer on the underlying layer, the guiding layer comprising guiding structures and being substantially planar;
  providing a block-copolymer layer on the guiding layer;
  inducing phase separation of the block-copolymer layer in a regular pattern of structures of a first and a second polymer component, whereby one of the components aligns to the guiding structures, by chemo-epitaxy; and
  thereafter, removing a first of the components of the block-copolymer layer completely, leaving a regular pattern of structures of the second component.

According to example embodiments, the underlying layer is an anti-reflective coating (ARC) layer, i.e. it has the properties of an ARC. The LiNe flow currently mainly uses 193 nm immersion lithography. The stack below the X-PS structures may absorb or reduce the reflectance of the 193 nm immersion light. In an example embodiment, the underlying layer can act as a hard mask layer for etching further underlying layers as for instance the substrate, for instance the silicon substrate. It may comprise or consist of Silicon Nitride, e.g. $Si_3N_4$, which can provide both functions. Other layer stacks may also provide both functions. For instance, alternatively, the underlying layer may comprise or consist of SiOC (DARC) on APF (Advanced Patterning Film (Trademark from AMAT)), SiON (CVD) on APF, SiON (PVD) on APF, $SiO_2$ on APF, SiOC on APF, Si-ARC on APF, SoG (spin-on-glass) on SoC (spin-on-carbon), $Si_3N_4$ on $SiO_2$, and/or $Si_3N_4$ on a-Si. Good results with respect to LER/LWR were achieved with a Silicon Nitride underlying layer. These results are typically better than with underlying layers which consist of or comprise an oxide-like material (such as $SiO_2$, SiON, SoG, and the like). In other embodiments, the underlying layer thus does not comprise an oxide-like material.

According to example embodiments, the planarizing layer is a silicon comprising polymer. It can be or comprise Spin-on Glass (SoG).

According to example embodiments, the block-copolymer comprises PS (Polystyrene)-PMMA (polymethyl methacrylate).

According to example embodiments, the guiding layer comprises x-PS (cross-linked polystyrene) structures laterally embedded in a neutral layer. The first component of the BCP can for instance comprise PS, while the second component can comprise PMMA. A neutral layer can be a mixture of PS-PMMA which neutralizes the surface energy in such that the BCP has no preferential orientation during the annealing/assembly. Thus, the XPS guiding stripe will guide the PS component.

According to example embodiments, the underlying layer is a dielectric layer. According to example embodiments, the method further comprises patterning a substrate layer below the underlying layer, thereby using the underlying layer as a hardmask.

In an example embodiment, the substrate layer may comprise or consist of silicon. It can be for instance a silicon wafer or silicon-on-insulator (SOI) wafer. It can be also be a germanium substrate or III-V substrate.

In a first aspect of the present disclosure, removing the first component of the block-copolymer layer completely, comprises reducing the width of the structures of the second component, and further comprises patterning the guiding layer before providing the planarizing layer, using the structures of the second component as a mask. This is the case for most chemistries and processing conditions used today. Some chemistries and processing conditions exist which allow a very high or perfect selectivity in the removal of the first component with respect to the second component. A corresponding process is described in relation with a second aspect of the present disclosure set out below.

According to example embodiments, the method further comprises providing an encapsulation layer over the structures of the second component and on exposed sidewalls of the patterned guiding layer, before providing the planarizing layer.

According to example embodiments, providing an encapsulation layer comprises exposing the structures of the second component and the patterned guiding layer to a $SiCl_4/O_2$ plasma. Alternatively, the polystyrene can be exposed to an HBr/O plasma process or perfluorinate chemistry to generate a polymerized protection layer on Polystyrene. The effect with the $SiCl_4/O_2$ encapsulation process is proven to be more efficient.

According to example embodiments, removing the structures of the second component, selectively with respect to the structures of the planarizing layer also comprises removing the encapsulation layer. This can thus be performed in a single process.

In a second aspect of the present disclosure, removing the first component of the block-copolymer layer, does not affect the width of the structures of the second component, further comprising patterning the guiding layer after removing the structures of the second component, by using the structures of the planarizing layer as a mask. This can for instance be achieved with a suitable method as for instance described in EP 2717296.

In a third aspect of the present disclosure, the method for forming transistor structures comprising applying the method according to any of the embodiments of the first or second aspect for patterning a substrate to thereby defining channel regions, and manufacturing transistor structures based on the channel regions.

Features and advantages disclosed for one of the above aspects of the present disclosure are hereby also implicitly disclosed the other aspects, mutatis mutandis, as the skilled person will recognize.

Certain objects and advantages of various inventive aspects have been described herein above. It is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

BRIEF DESCRIPTION OF THE FIGURES

The disclosure will be further elucidated by means of the following description and the appended figures.

FIG. 6(b) illustrates an inclination effect that may occur on the planarization layer structures, due to the different interaction with the underlying X-PS and NUL layers.

DETAILED DESCRIPTION

Figure 1:
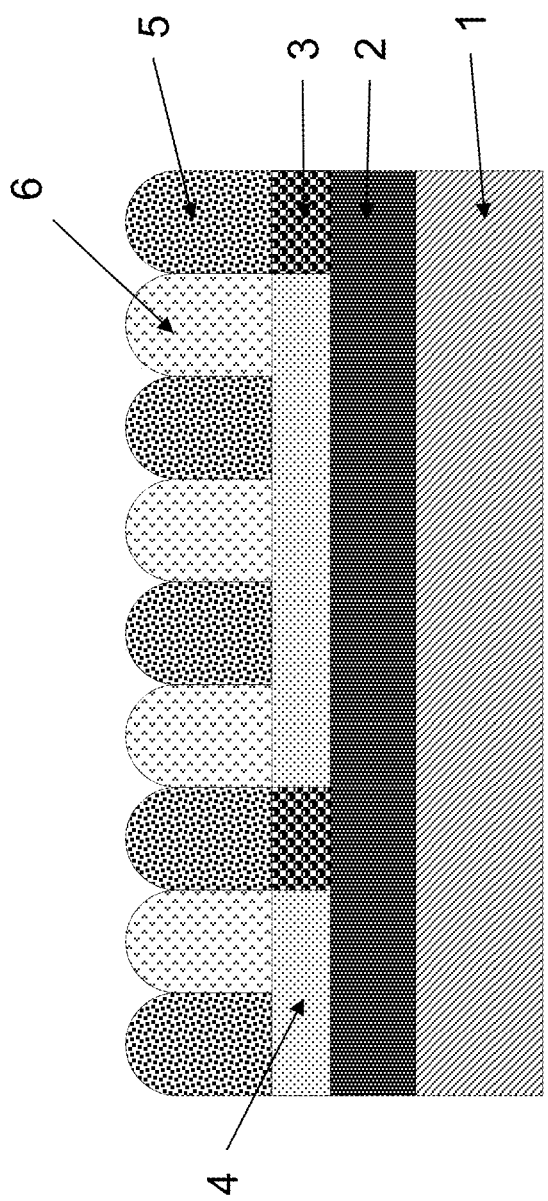
FIG. 1 shows a setup which can be a starting point for methods according to aspects of the present disclosure; which can be the result of a LiNe process flow.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments are to be construed as exemplary manners in which the disclosure may be implemented rather than as limiting the scope of the disclosure.

Figure 4:
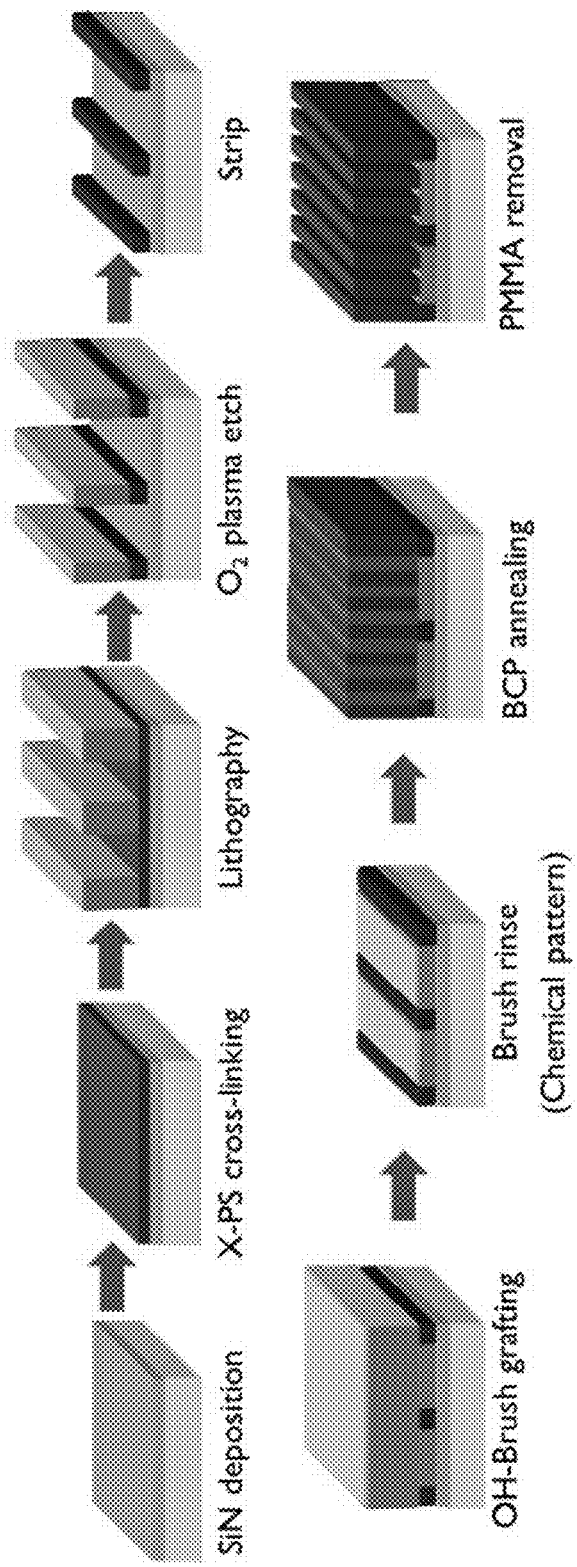
FIG. 4 illustrates a LiNe process flow.

FIG. 4 illustrates the "LiNe" flow known to the skilled person. The initial setup for performing any of the methods according to example embodiments may include a setup which is common with the LiNe flow. That is, the initial setup may be achieved by performing a number of initial steps of a LiNe flow. Common steps with the LiNe flow can for instance include the following:

the deposition of a dielectric e.g. anti reflection coating (ARC) layer (2) (for instance $Si_3N_4$) on a substrate (1) finally to be patterned (e.g. a silicon substrate as for instance a silicon wafer, or a silicon on insulator substrate);

providing a X-PS layer on the ARC layer;

patterning the X-PS layer into a set of parallel stripes, by means of photolithography, resulting in a set of parallel X-PS guiding lines on the ARC layer;

providing a brush or so-called "neutral" layer over the X-PS structures and ARC layer, grafting the brush layer and removing the excess of material, for instance by rinsing of the brush material which was not grafted, resulting in a guiding layer (3,4) on the ARC layer (2);

providing a BCP layer (5,6) on the guiding layer (3,4); and inducing phase separation of the two components (5) (6) of the BCP layer, for instance by annealing; ending up in a situation depicted in FIG. 1.

A typical LiNe type process further comprises:

removing a first component (6) selectively with respect to a the second component (5); and using the second component (5) as a mask for patterning a set of underlying layers (as for instance the guiding layer, ARC layer and substrate).

Based on the state of the art LiNe (chemo-epitaxy) flow, it has been observed that the LER of the PS lines increased during pattern transfer to underlying layers. The LER increased significantly when a transfer into the silicon substrate through the neutral layer and $Si_3N_4$ anti-reflective coating (ARC) was performed. However, the LWR reduced to less than 2.0 nm after silicon etch, which is good for future advance patterning nodes.

Figure 5:
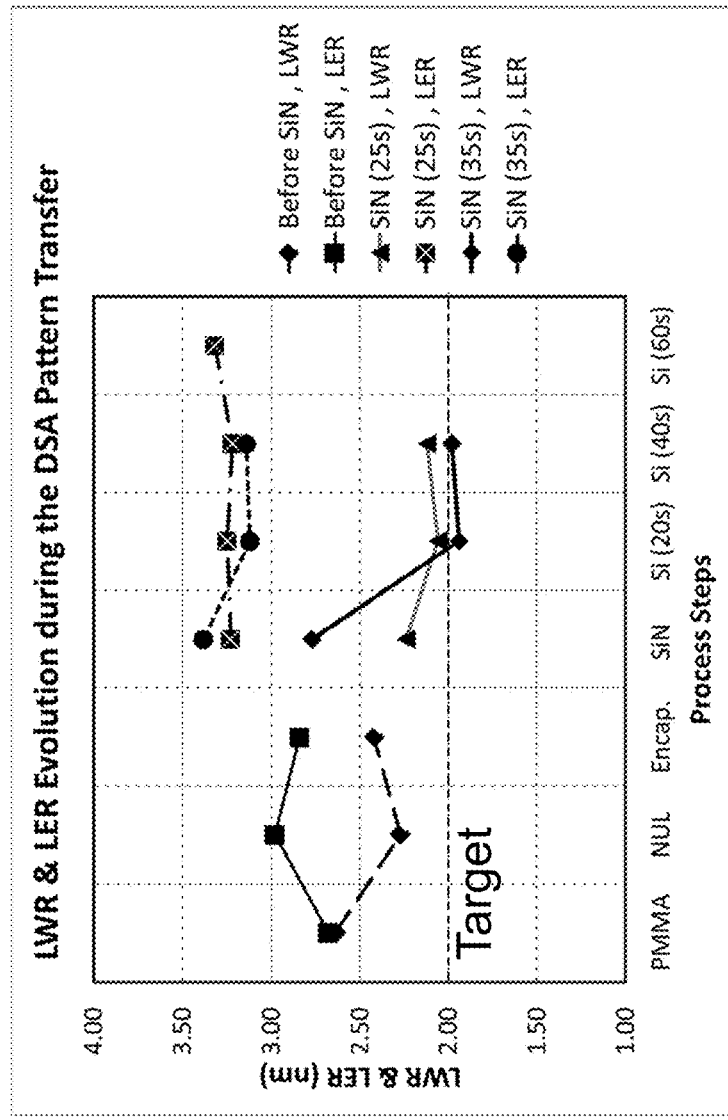
FIG. 5 illustrates the evolution of LER/LWR values in different steps of the LiNe process flow, as well as in process flows according to aspects of the present disclosure.

FIG. 5 illustrates LER and LWR values for obtained after different process steps in a LiNe process: after PMMA removal, after etch in the guiding layer/neutral layer, after providing an encapsulation layer (this step being part of the solution according to embodiments described further below), after etching the underlying layer 2, e.g. a $Si_3N_4$ layer (which can both function as ARC layer and as hard mask layer for patterning a layer below that layer), and after different etching durations in the silicon substrate layer. It shows that the LWR and LER are in the range of 2.5 nm to 3.0 nm after a suitable (e.g. 20 second) PMMA etch. However, the LWR and LER values show opposite trends when the subsequent guiding layer (3,4) (neutral (NUL) layer laterally embedding the guiding structures (3)) is patterned. The LWR reduced from 2.6 nm to 2.1 nm after a subsequent suitable (20 second) etch in the underlying silicon substrate (1), but the LER increased from 2.6 nm to 3.3 nm. Furthermore, the longer the duration of the silicon etching process, the higher the LER value became.

The reason for the LER deterioration after the PS line pattern transfer to NUL was unknown. One hypothesis was attributed to the difference in polymer material underneath the Polystyrene. Under a 3×multiplication of a DSA LiNe flow, some of the Polystyrene lines will be guided by the X-PS, cross-linkable Poly(styrene-random-vinylbenzocyl-cobutene), while the neighbouring Polystyrene lines will be grafted on the neutral layer, e.g. the hydroxyl-terminated poly(styrene-random-methylmethacrylate) [PS-r-PMMA-OH] brush layer. The mechanical stability is higher on the cross-linkable Polystyrene (X-PS) as compared to stability on the neutral layer.

An XSEM picture (not disclosed) was made of a structure in which a DSA pattern transfer through 7 nm thick NUL layer and a combination (forming a hard mask layer) of 15 nm SiO2 and 40 nm APF was performed. One could indeed easily identify those APF lines originating from Polystyrene lines guided by the X-PS guiding lines (3).

Aspects of the present disclosure provide a solution to this problem, by providing a pattern inversion between the remaining PS (second component) structures (5) and a suitable, silicon comprising planarizing layer (8). Instead of using the second component structures, as is the case in a standard LiNe flow, structures of the planarizing layer (8) are used to pattern the underlying layer(s). It has been demonstrated that such an approach improved LER and LWR as compared to the standard LiNe flow.

Figure 2:
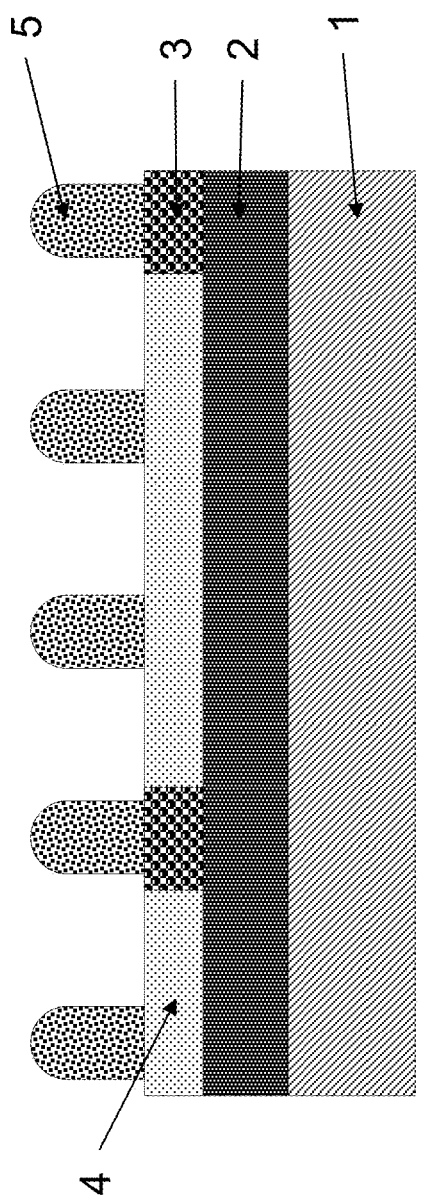
FIGS. 2(a) to 2(g) illustrate embodiments of the first aspect of the present disclosure.
Figure 2:
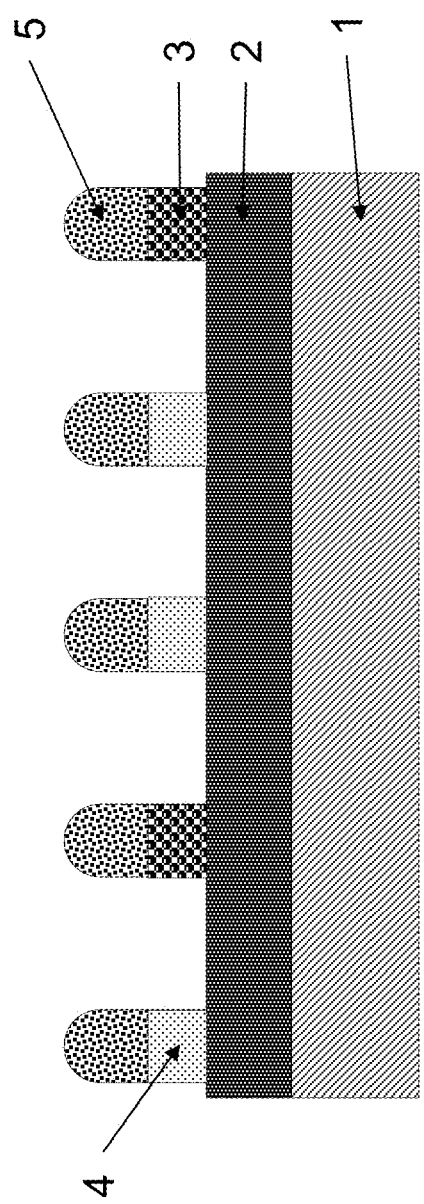
Figure 2:
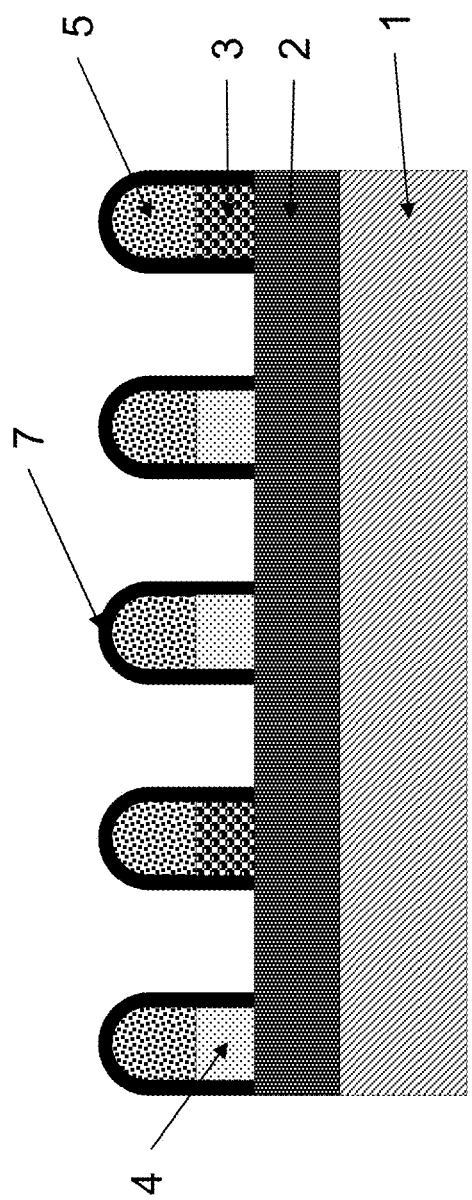
Figure 2:
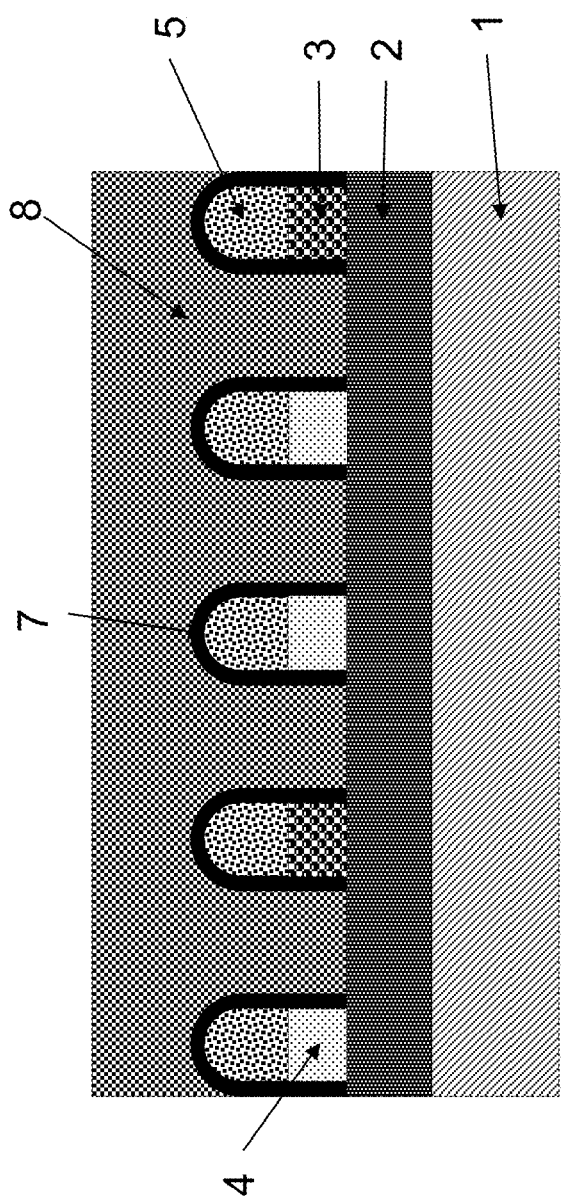
Figure 2:
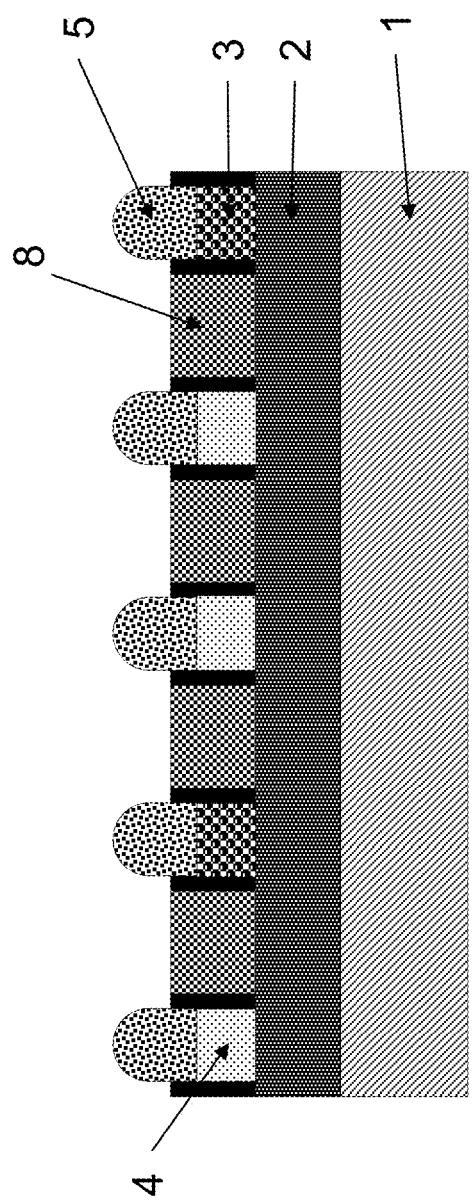
Figure 2:
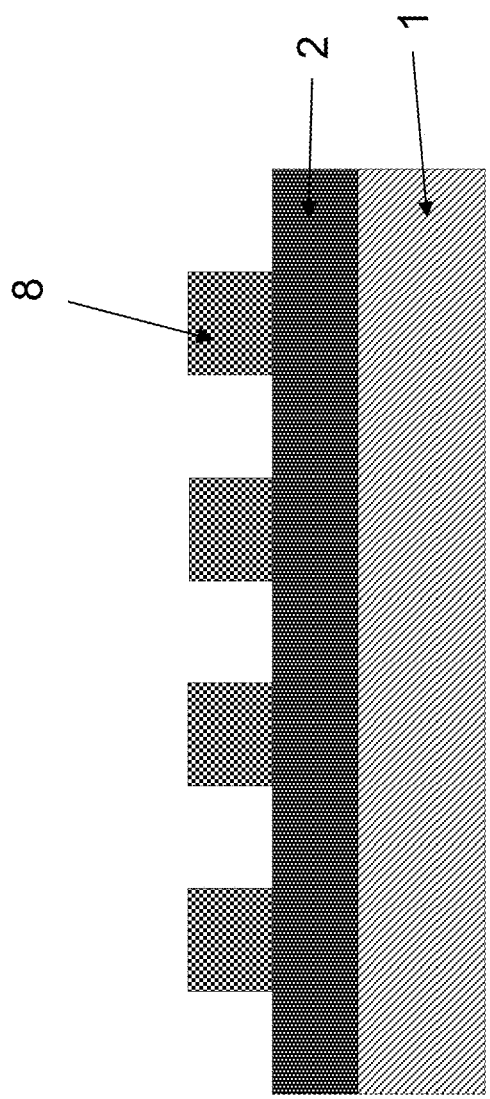

For instance, the following processes may be performed:
providing a planarizing layer (8) over the regular pattern of structures of the second component (5) and the guiding layer (3,4) (See FIG. 3(b), FIG. 2(d));
removing a portion of the planarizing layer (8), thereby leaving a regular pattern of structures of the planarizing layer (8) at positions in between the structures of the second component (5), and exposing the structures of the second component (5) (FIG. 3(c), FIG. 2(e));
removing the structures of the second component (5), selectively with respect to the structures of the planarizing layer (8) (FIG. 3(d); FIG. 2 (f)); and
patterning the underlying layer (2), thereby using the structures of the planarizing layer (8) as a mask (FIG. 3(e); FIG. 2(g)).

Figure 3:
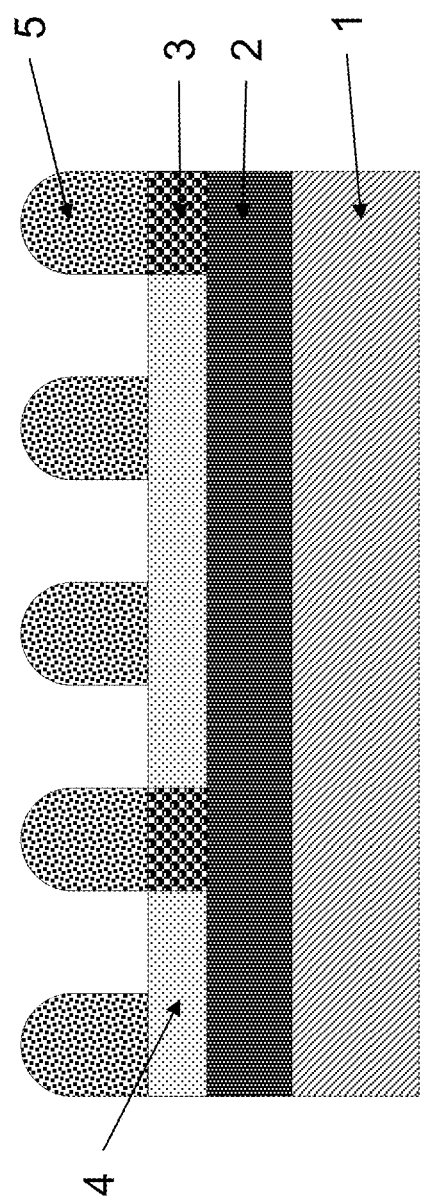
FIGS. 3(a) to 3(e) illustrate embodiments of the second aspect of the present disclosure.
Figure 3:
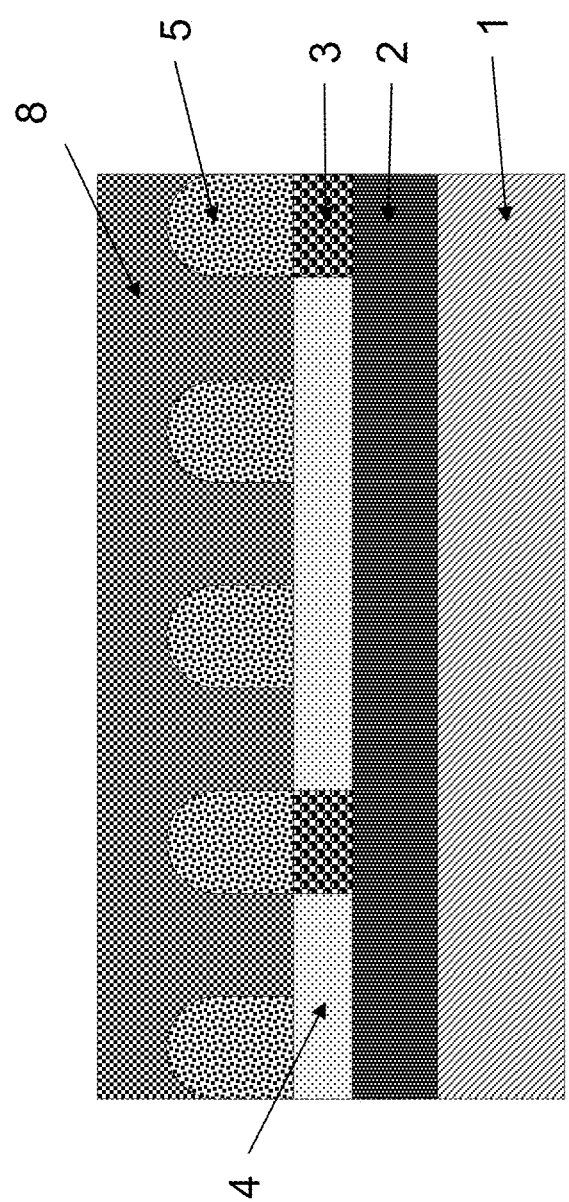
Figure 3:
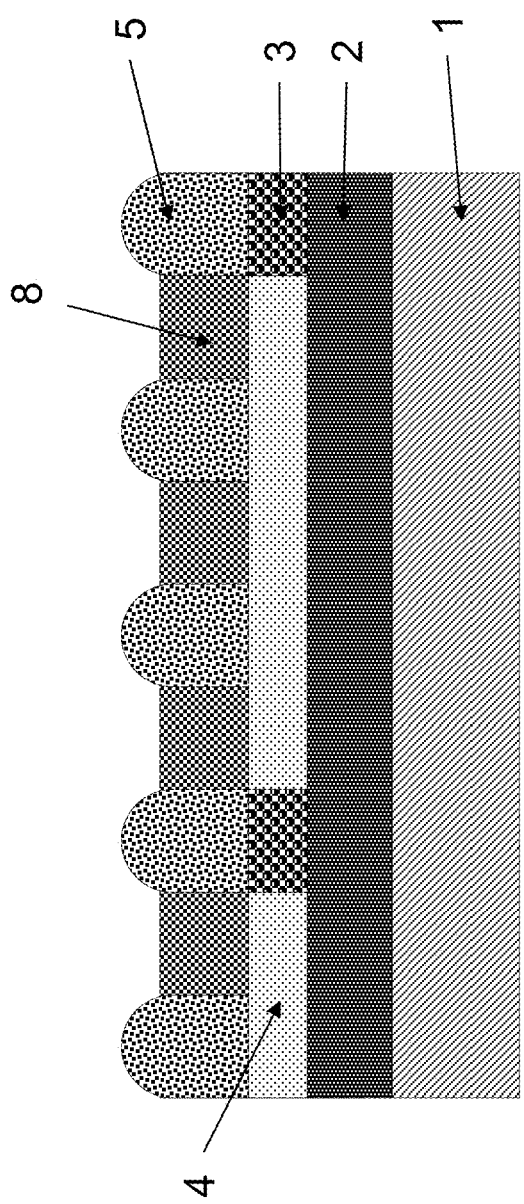
Figure 3:
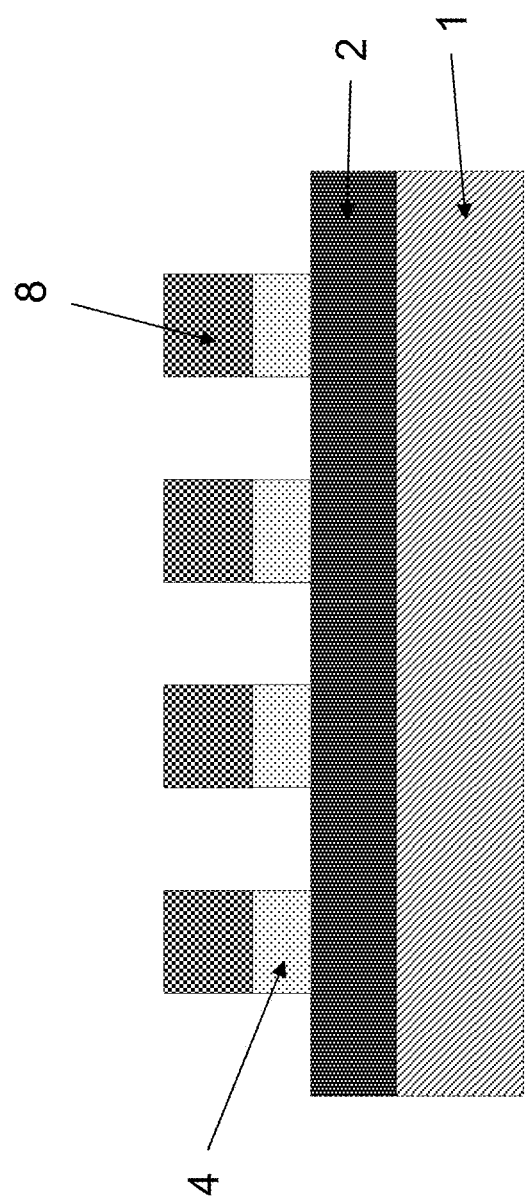
Figure 3:
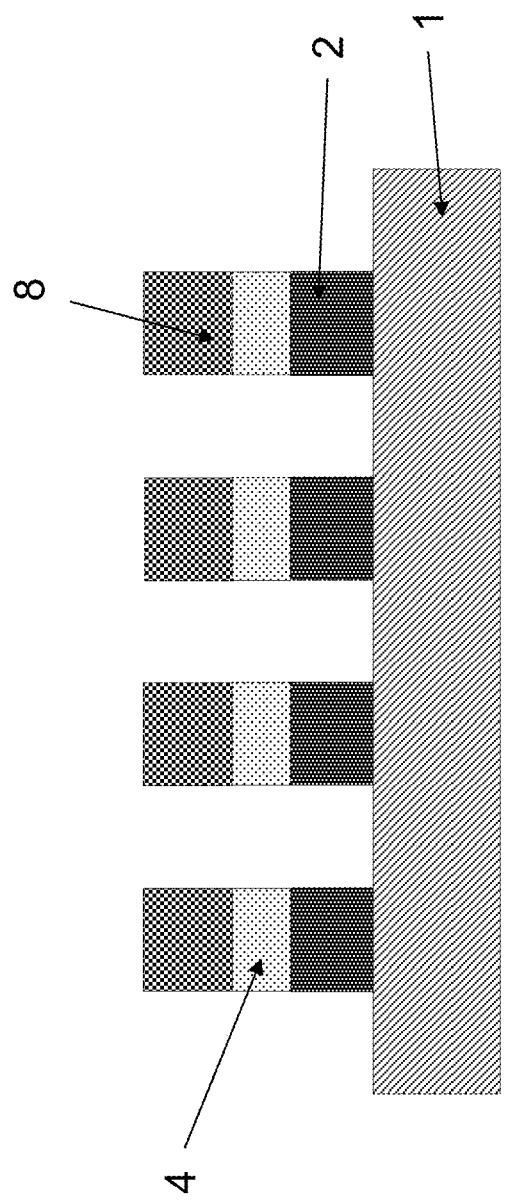

In a second aspect of the present disclosure, illustrated by means of FIG. 3 (a) to (e), which will be described first for practical reasons, removing the first component (6) of the block-copolymer layers, does not affect the width of the structures of the second component (5) (FIG. 3(a)) (e.g. an etch selectivity of PS to PMMA is smaller than 1:2). The planarizing layer (8) is provided directly after having removed the first component (6) (FIG. 3(b)), i.e. on the PS lines remaining after removal of the PMMA lines of the DSA pattern. For instance a spin-coated silicon comprising polymer material/layer (8) can be applied, for example a Spin-on-Glass (SoG). The SoG material should be thick enough to cover, for instance, about 25 nm thick Polystyrene material/structures (5). The portion of the planarizing layer (8) is then removed (FIG. 3(c)), exposing (an upper portion/ an upper surface of) the structures of the second component (5) (e.g. PS lines). Thereafter, the structures of the second component (5) are removed, selectively with respect to the structures of the planarizing layer (8) (FIG. 3(d)). For instance, an Ar/O$_2$ stripping chemistry can be applied to remove the polystyrene selectively with respect to the material of the silicon comprising planarizing layer (8). The method may then comprise patterning the guiding layer (3, 4) after removing the structures of the second component (5), by using the structures of the planarizing layer (8) as a mask (also in FIG. 3(d)). The pattern can be transferred further down the layer stack as for instance into the underlying layer, and/or into the (e.g. silicon) substrate where it would eventually define functional structures as for instance fin structures of a transistor device of the fin-type, e.g. a FINFET.

A typical LER value after NUL/guiding layer (3, 4) etch is about 3.0 nm in a conventional LiNe type approach. Tests showed that a significant reduction in LER (to 2.2-2.6 nm) after the PS removal can be achieved with embodiments of the second aspect of the present disclosure, while the LWR increases only slightly. This implies that the proposed use or the silicon comprising planarization material/polymer improves the final LER values of patterned underlying layers.

Figure 6:
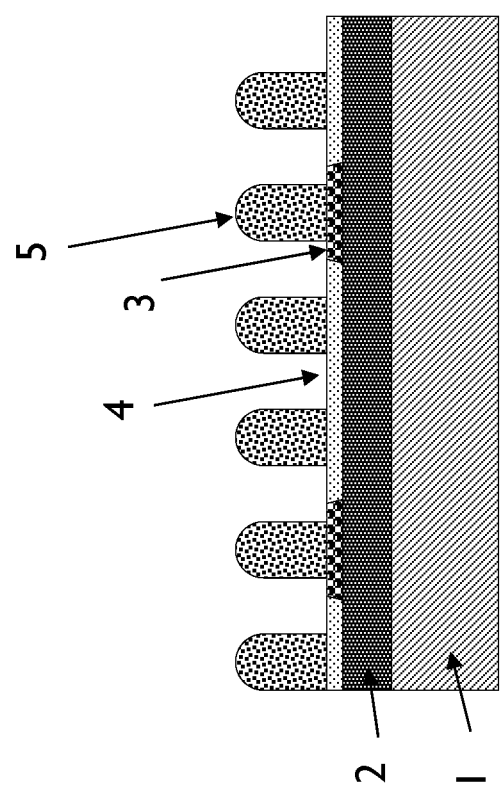
FIG. 6 (a) illustrates polystyrene lines after PMMA line removal, as in a standard DSA flow.
Figure 6:
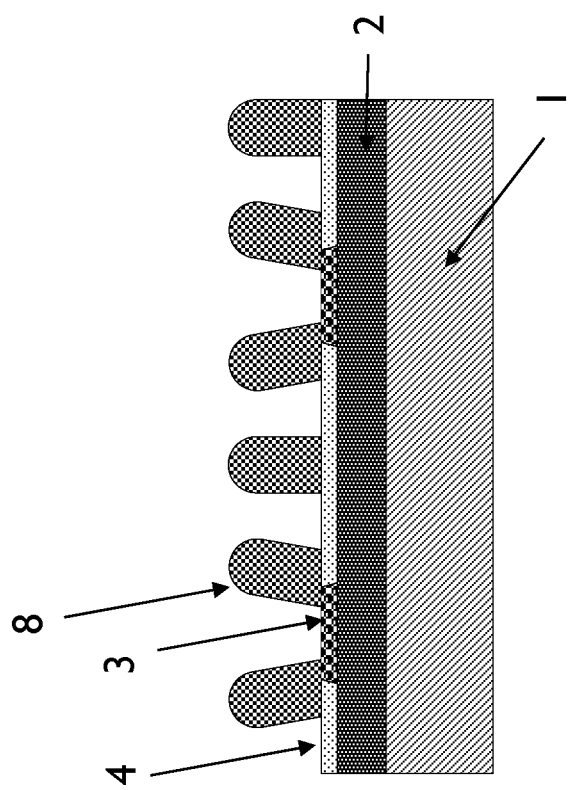

Although the embodiments of the second aspect are promising and it is possible to reduce them to practice, it was observed that some planarizing layer line structures are slightly tilted, i.e. form an angle different from zero with the normal on the NUL layer, after the PS removal. It is believed that this is due to the fact that some planarizing layer 8 structures are located exclusively on the NUL layer 4, while others are located also partially on the X-PS guiding stripes. The latter planarizing layer structures may therefore have a tilted orientation, away from the X-PS guiding stripes. To illustrate the effect, FIG. 6 (a) schematically shows polystyrene lines after PMMA line removal, as in a standard DSA flow. FIG. 6(b) illustrates the inclination effect (inclination is exaggerated) that may occur on the planarization layer structures, due to the different nature of the underlying X-PS and NUL layers.

In a first aspect of the present disclosure, illustrated in FIG. 2(a) to (g), removing the first component (6) of the block-copolymer layers comprises reducing the width of the structures of the second component (5) (FIG. 2(a)). This can be a consequence of a relatively low level of etch selectivity (e.g. an etch selectivity of PS to PMMA larger than 1:2) for removing the structures of the first component (6) towards the structures of the second component (5). In such embodiments, patterning the guiding layer (3, 4) may be performed before providing the planarizing layer (8), using the structures of the second component (5) as a mask (FIG. 2(b)). That is, in some embodiments, patterning the guiding layer may take place directly or immediately after removing the structures of the first component. Moreover, an encapsulation layer (7) may be provided over the structures of the second component (5) and on exposed sidewalls of the patterned guiding layer (3, 4), before providing the planarizing layer (8) (FIG. 2(c)).

The encapsulation layer (7) can be provided for instance by exposing the structures of the second component (5) and (sidewalls of) the patterned guiding layer (3, 4) to a plasma, for instance a SiCl4/O2 plasma. The planarizing layer (8) is provided directly, after having provided the capping layer (7) (FIG. 2 (d)). The portion of the planarizing layer (8) is then removed (FIG. 2(e)), exposing (an upper portion/an upper surface of) the structures of the second component (5). Thereafter, the structures of the second component (5) are removed, selectively with respect to the structures of the planarizing layer (8) (FIG. 2(f)). Also the encapsulation layer (7) is hereby removed, as well as the remaining portions of the guiding layer (3, 4) present below the structures of the second component (5). A regular pattern of planarizing layer structures is now present on top of an unpatterned hard mask layer (2).

It was found that the encapsulation process can restore the polystyrene lines by re-deposit $SiO_xF_y$ polymer material on the polystyrene structures (5). The encapsulation also showed to improve the LWR and LER after the PMMA and NUL(guiding layer) etch.

The following process was carried out:
a standard LiNe-type DSA chemo-epitaxy process was performed with BCP (PS-b-PMMA) (5,6), which was first coated and annealed in order to induce phase separation of the two components, PS and PMMA, on top of a NUL/x-PS guiding layer (3,4), the latter being provided on a Si$_3$N$_4$ hard mask layer (2) on a silicon substrate (1);

the PMMA (6) and guiding layer (3, 4) were etched in the same chamber. Typically the PS (5) height after PMMA/NUL removal is smaller than 25 nm;

an in-situ SiCl$_4$/O$_2$ encapsulation process was applied without breaking the plasma in the chamber;

a planarizing layer of Spin-on-Glass (SoG) material (or a silicon containing planarization polymer) was provided on top of the PS lines. A 40-60 nm thick SoG was provided that covered the PS lines and planarized the silicon surface;

a 1st selective Plasma etch back process was performed on the SoG with a CF4 chemistry, until part of the Polystyrene lines are exposed to the plasma;

a 2nd selective plasma etch process was performed to remove the SiO$_x$F$_y$ encapsulated Polystyrene lines, in a single step; and a 3rd plasma etch was performed to transfer the DSA pattern into the underlying hardmask stack, the Si$_3$N$_4$ layer.

The results show that the encapsulation step could restore more than 2 nm CD which was lost on Polystyrene lines during the NUL etch. Moreover, the use of the encapsulation step and associated process reduced the LWR and LER values after post-NUL etch, which were sometimes even better as compared to the values at the post-PMMA stage.

In order to have good DSA lines as a template for the silicon containing polymer material, partial DSA lines are used (corresponding to a first of the components of the BCP used) which provide a good or reasonable low Line Width Roughness (LWR) and Line Edge Roughness (LER). This is determined by the removal process (etching) of the other component of the block-copolymer material. In principle, the silicon comprising polymer material can be provided (e.g. coated) after PMMA etch (i.e. removal of the other/ second component); after the NUL layer etch or after the encapsulation process of the PS structures.

Figure 7:
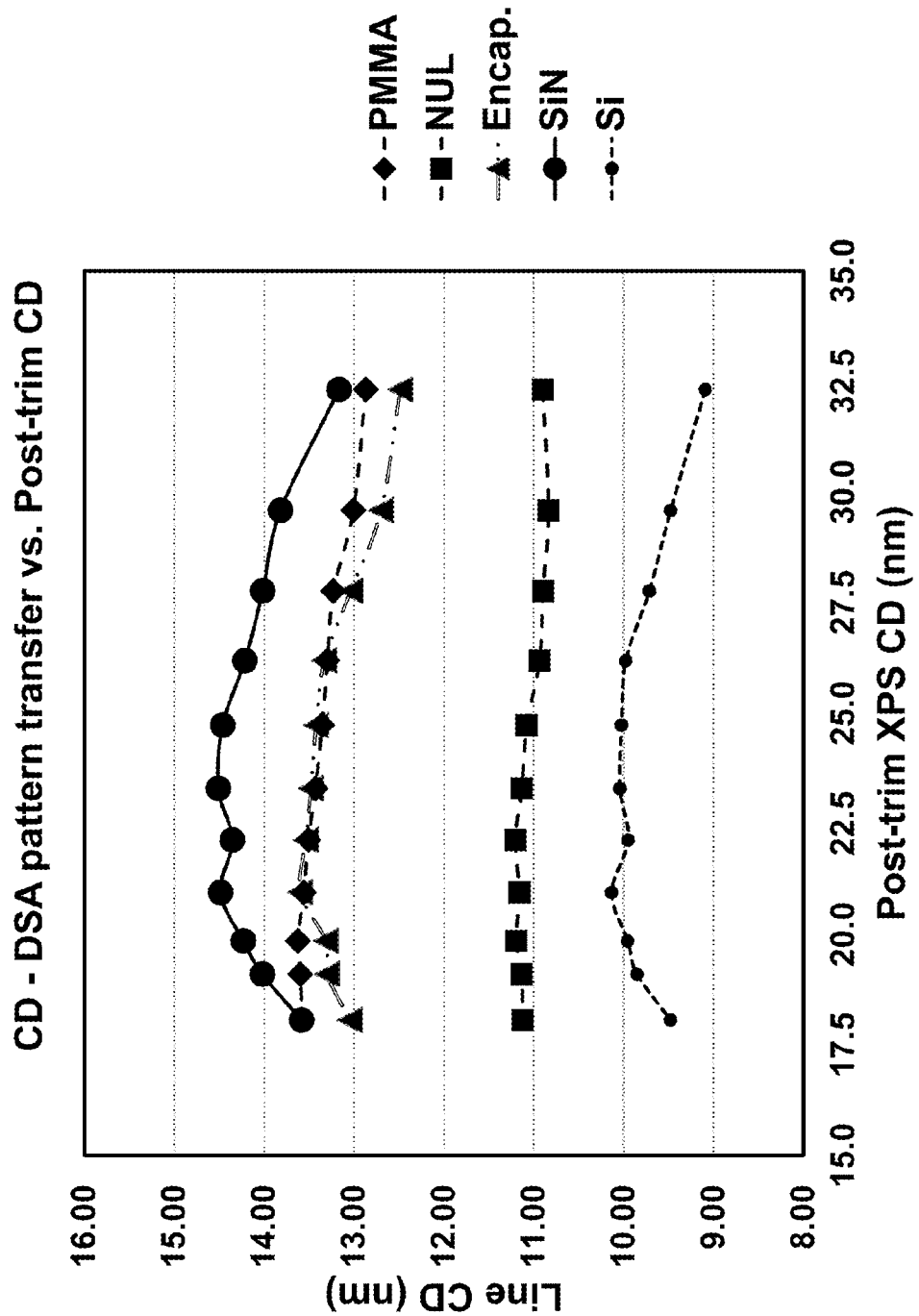
FIG. 7 illustrates the critical dimension at various steps in the DSA pattern transfer process according to example embodiments, versus the post-trim CD of the guiding striped (X-PS stripes).
Figure 8:
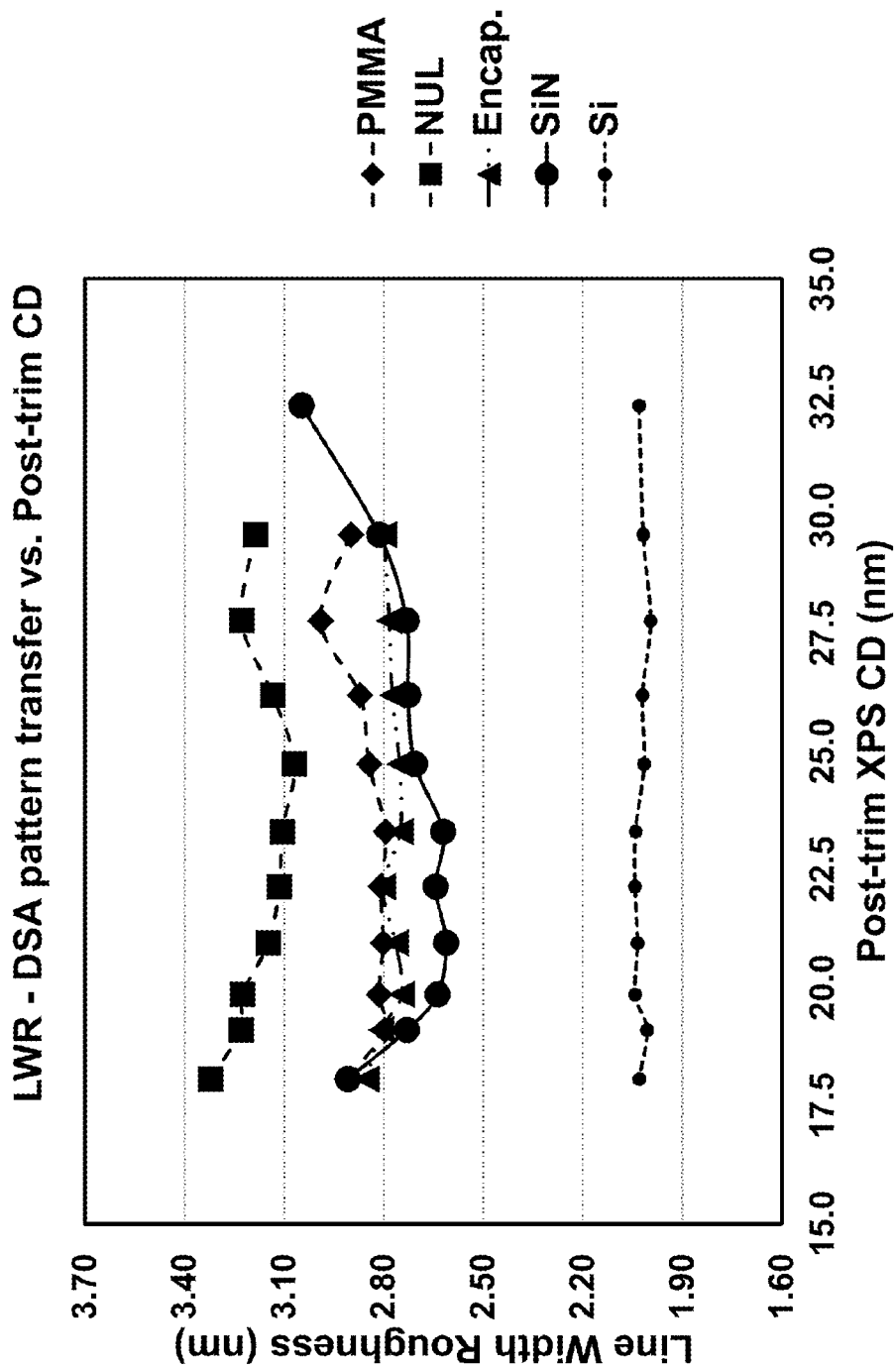
FIG. 8 illustrates the LWR at various steps in the DSA pattern transfer process versus the post-trim CD of the guiding striped (X-PS stripes).
Figure 9:
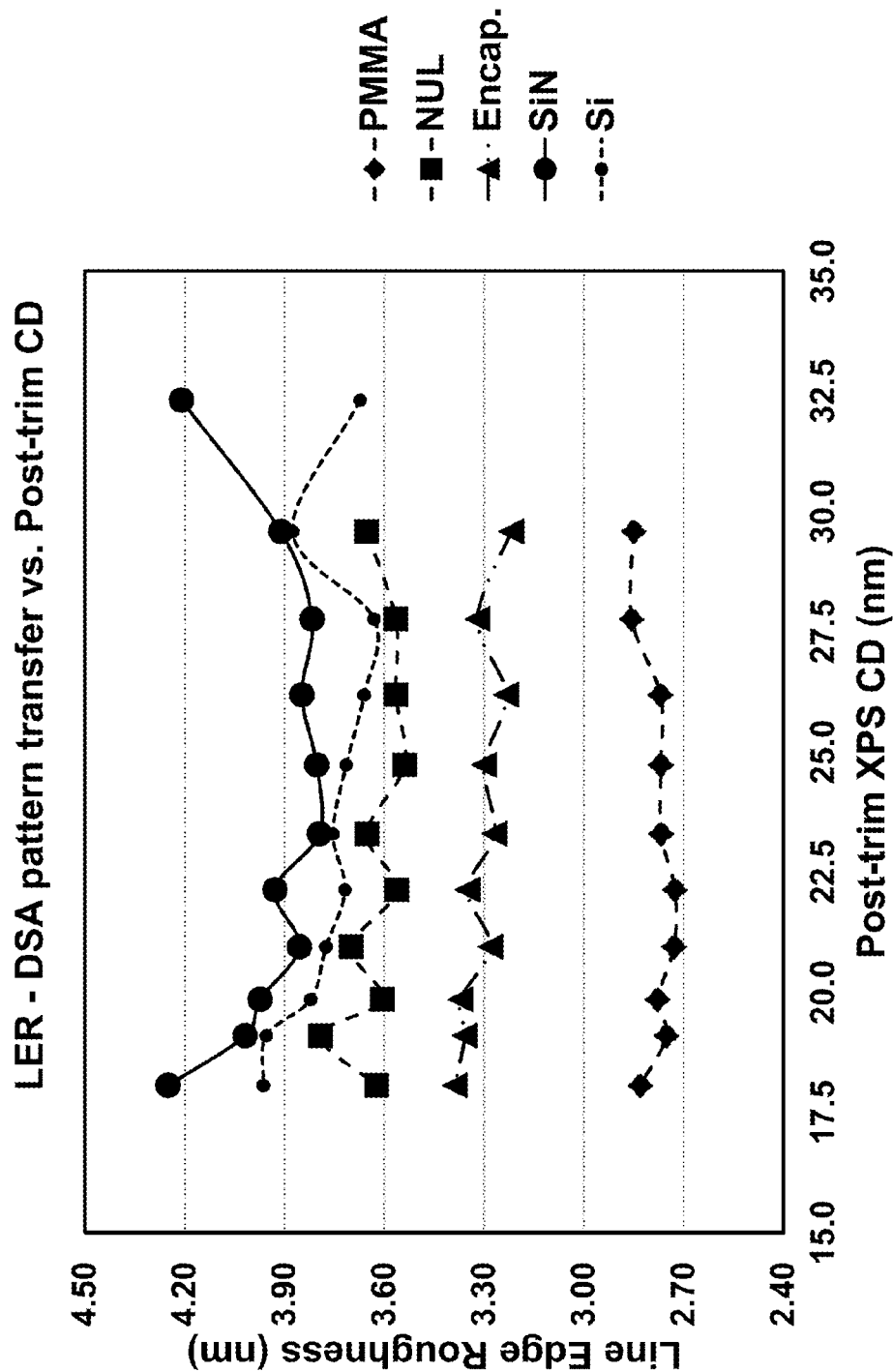
FIG. 9 illustrates the LER at various steps in the DSA pattern transfer process versus the post-trim CD of the guiding striped (X-PS stripes).

The following figures illustrate the evolution of the Polystyrene lines CD, LWR, and LER versus the post-trim CD of the XPS guiding stripes. Experiments were done on wafers that were exposed in dose stripes, while keeping the focus constant during the exposure. FIG. 7 illustrates the critical dimension at various steps in the DSA pattern transfer processes versus the post-trim CD of the guiding striped (X-PS stripes). FIG. 8 illustrates the LWR at various steps in the DSA pattern transfer processes versus the post-trim CD of the guiding striped (X-PS stripes). FIG. 9 illustrates the LER at various steps in the DSA pattern transfer processes versus the post-trim CD of the guiding striped (X-PS stripes).

At least the following can be concluded:

the CD of the polystyrene lines for post-PMMA and post-Encapsulation are compatible, whereas the CD for post-NUL is smaller. This implies that the CD became smaller after neutral layer etch and that the encapsulation step did restore the polystyrene lines;

the LWR of the post-PMMA and Encapsulation are equal, but the post-NUL LWR is relatively high. As low LWR/LER values are targeted before providing the planarizing layer (silicon comprising polymer layer), the planarizing layer may be applied after PMMA etch or after encapsulation;

the LER value after encapsulation is similar to the LER value after PMMA removal;

the LWR & LER values after the NUL etch seem to have increased. It may thus be less preferred to apply the planarizing layer directly after neutral layer etch;

the LWR for after Si$_3$N$_4$ etch and after Si etch are improved, but LER for both cases are still higher, as compare to the values after encapsulation. Using the encapsulation allows achieving a better LER as the silicon containing lines have better etch resistance during the subsequent pattern transfer in a further layer below or into the substrate.

It will be appreciated that embodiments of the present disclosure may provide various advantages when compared to conventional methods. For instance, etch selectivity is improved. A higher etch selectivity can be achieved when the Polystyrene is substituted as a mask by the silicon comprising planarizing layer, e.g. the spin-coated SoG, for patterning the underlying layer eventually. Indeed, stripes of the planarizing layer are used for pattern transfer into the underlying layer, instead of the PS lines. Also, the SoG (or Si-comprising planarization polymer) has better mechanical stability as compared to Polystyrene, which improves LWR/ LER after the pattern transfer of the SoG lines. Also, applying the planarizing material after DSA Encapsulation provides better DSA lines as there is no impact of the topography due to the chemo-epitaxy process.

While the above detailed description has shown, described, and pointed out novel features of the disclosure as applied to various embodiments, it will be understood that various omissions, substitutions, and changes in the form and details of the device or process illustrated may be made by those skilled in the technology without departing from the essence of the disclosure.

What is claimed is:

1. A method for patterning an underlying layer, the method comprising providing a guiding layer on the underlying layer, the guiding layer being substantially planar and comprising guiding structures;

providing a block-copolymer layer on the guiding layer;

inducing phase separation of the block-copolymer layer in a regular pattern of structures of a first polymer component and a second polymer component, whereby one of the polymer components aligns to the guiding structures, by chemo-epitaxy;

thereafter, removing the first polymer component completely, thereby leaving a regular pattern of structures of the second polymer component;

providing a planarizing layer over the regular pattern of structures of the second polymer component and the guiding layer;

removing a portion of the planarizing layer, thereby leaving a regular pattern of structures of the planarizing layer at positions in between the structures of the second polymer component, and exposing the structures of the second polymer component;

removing the structures of the second polymer component selectively with respect to the structures of the planarizing layer; and patterning the underlying layer, wherein patterning the underlying layer uses the structures of the planarizing layer as a mask.

2. The method according to claim 1, wherein removing the first polymer component of the block-copolymer layers comprises reducing the width of the structures of the second polymer component, wherein the method further comprises patterning the guiding layer before providing the planarizing layer, wherein patterning the guiding layer uses the structures of the second polymer component as a mask.

3. The method according to claim 2, further comprising providing, before providing the planarizing layer, an encapsulation layer over the structures of the second polymer component and on exposed sidewalls of the patterned guiding layer.

4. The method according to claim 3, wherein providing an encapsulation layer comprises exposing the structures of the second polymer component and the patterned guiding layer to a $SiCl_4/O_2$ plasma.

5. The method according to claim 3, wherein removing the structures of the second polymer component selectively with respect to the structures of the planarizing layer also comprises removing the encapsulation layer.

6. The method according to claim 1, wherein removing the first polymer component of the block-copolymer layers does not affect the width of the structures of the second polymer component, wherein the method further comprises patterning the guiding layer after removing the structures of the second polymer component, wherein patterning the guiding layer after removing the structures of the second polymer component uses the structures of the planarizing layer as a mask.

7. The method according to claim 1, further comprising patterning a substrate layer below the underlying layer, wherein patterning the substrate layer below the underlying uses the underlying layer as a hardmask.

8. The method according to claim 1, wherein the underlying layer is an anti-reflective coating layer and comprises $Si_3N_4$.

9. The method according to claim 1, wherein the planarizing layer is a silicon comprising polymer.

10. The method according to claim 1, wherein the block-copolymer comprises PS-PMMA.

11. The method according to claim 1, wherein the guiding layer comprises x-PS structures laterally embedded in a neutral layer.

12. A method for forming transistor structures comprising applying the method according to claim 1 for patterning a substrate to thereby define channel regions, and form transistor structures based on the channel regions.

* * * * *